United States Patent
Lai

(10) Patent No.: US 6,518,103 B1
(45) Date of Patent: Feb. 11, 2003

(54) METHOD FOR FABRICATING NROM WITH ONO STRUCTURE

(75) Inventor: Jiun-Ren Lai, Pingtung (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/026,856

(22) Filed: Dec. 20, 2001

(30) Foreign Application Priority Data

Dec. 10, 2001 (TW) .......................... 90130497 A

(51) Int. Cl.$^7$ ............................................. H01L 21/00
(52) U.S. Cl. .................. 438/150; 438/262; 438/689; 438/711
(58) Field of Search .................. 438/257, 262, 438/282, 689, 710, 711, 719, 723.724, 738

(56) References Cited

U.S. PATENT DOCUMENTS 4,222,838 A * 9/1980 Bhagat et al. .............. 204/192
4,283,249 A * 8/1981 Ephrath ...................... 156/643

* cited by examiner

Primary Examiner—Carl Whitehead, Jr.
Assistant Examiner—Yennhu B. Huynh
(74) Attorney, Agent, or Firm—J. C. Patents

(57) ABSTRACT

A method for fabricating a NROM is described, in which a bottom anti-reflective coating (BARC) and a photoresist pattern are sequentially formed on a substrate that has a charge trapping layer formed thereon. An etching process is then performed to pattern the BARC and the charge trapping layer with the photoresist pattern as a mask. The etching process is conducted in an etching chamber equipped with a source power supply and a bias power supply, which two have a power ratio of 1.5~3, while an etchant used therein is a gas plasma containing trifluoromethane ($CHF_3$) and tetrafluoromethane ($CF_4$). Thereafter, a buried drain is formed in the substrate, a buried drain oxide layer is formed on the buried drain, and then plural gates are formed on the substrate.

20 Claims, 6 Drawing Sheets

METHOD FOR FABRICATING NROM WITH ONO STRUCTURE

CROSS-REFERENCE TO RELATED APPLICATION

This application claims the priority benefit of Taiwan application serial no. 90130497, filed Dec. 10, 2001.

BACKGROUND OF THE INVENTION

1. Field of Invention

The present invention relates to a method for fabricating a non-volatile memory (NVM). More particularly, the present invention relates to a method for fabricating a NROM.

2. Description of Related Art

The family of non-volatile memory includes the electrically erasable and programmable read-only memory (EEPROM), which can be programmed and erased electrically with low power consumption and is capable of retaining data as the power is turned off, and therefore is widely used in personal computers and electronic apparatuses. Particularly, the flash memory among the EEPROM family is highly integrated and has a higher speed for data erasing because the data in a flash memory is erased block by block.

A conventional flash memory comprises a floating gate and a control gate, which two are formed from doped polysilicon. When the flash memory is being programmed, hot electrons are injected into the polysilicon floating gate and are distributed evenly in the entire floating gate. However, when there are defects in the tunnel oxide layer under the polysilicon floating gate, the electrons stored in the floating gate easily leak out so that the reliability of the memory device is lowered.

In order to prevent the leakage and other problems of the EEPROM, a NROM structure is recently provided. When the memory device is programmed with proper biases applied on the control gate and the source/drain region, hot electrons are generated in the channel near the drain region and injected into the charge trapping layer. Since the silicon nitride is capable of trapping electrons, the injected electrons will be localized in the charge trapping layer, rather than distribute evenly in the entire charge trapping layer. Consequently, the charge trapping region is quite small and is thus less likely to locate on the defects of the tunnel oxide layer. The leakage is thereby less in the memory device.

Refer to FIGS. 1A~1E, which illustrate a process flow of fabricating a NROM in a cross-sectional view in the prior art.

Refer to FIG. 1A, a bottom anti-reflective coating (BARC) 110 is formed on an ONO stacked structure 108 on a substrate 100, wherein the ONO stacked structure 108 comprises a silicon oxide layer 102, a silicon nitride layer 104, and a silicon oxide layer 106. A photoresist pattern 112 is then formed on the bottom anti-reflective coating 110 not covering a region of the substrate 100 in which a buried drain will be formed.

Refer to FIG. 1B, an etching process is then performed to remove the BARC 110 and the stacked structure 108 not covered by the photoresist pattern 112, so as to expose a portion of the substrate 100.

It is noted in the above-mentioned etching process that the photoresist pattern 112 is not only etched vertically to decrease in its effective thickness, but is also etched laterally to cause a pull-back. Consequently, the edge of the BARC 110 not covered by the photoresist pattern 112 will be etched to form an indentation 111 thereat.

Refer to FIG. 1C, an ion implantation is then conducted to form a buried drain 114 in the exposed substrate 100, wherein the edge portion of the silicon oxide layer 106 is also implanted with dopants 116 because of the indentation 111 at the BARC 110.

Refer to FIG. 1D, the photoresist pattern 112 and the BARC 110 are then removed to expose the silicon oxide layer 106. Since the edge portion of the silicon oxide layer 106 having dopants 116 is easily etched by chemical during the removal of the photoresist pattern 112 and the BARC 110, the effective thickness of the edge portion of the ONO stacked structure 108 is decreased. Thereafter, a buried drain oxide layer 118 is formed on the buried drain 114.

Refer to FIG. 1E, a polysilicon layer 120 is then formed on the substrate 100 to cover the ONO stacked structure 108 and the buried drain oxide layer 118. Finally, the polysilicon layer 120 is patterned to form plural gate structures (not shown) perpendicular to the buried drain 114, thus completing the NROM process.

However, since the effective thickness of the edge portion of the ONO stacked structure is decreased during the removal of the photoresist pattern and the BARC, a voltage breakdown occurs more easily in the substrate under the edge portion of the ONO stacked structure to deteriorate the characteristics of the memory device.

SUMMARY OF THE INVENTION

Accordingly, this invention provides a method for fabricating a NROM to prevent a pull-back of the photoresist pattern during the patterning of the ONO stacked structure.

This invention also provides a method for fabricating a NROM to maintain the thickness of the edge of the ONO stacked structure, so as to prevent the voltage breakdown of the NROM device.

This invention further provides a method for fabricating a NROM to promote the reliability of the NROM device.

In the method for fabricating a NROM of this invention, a substrate is provided with a charge trapping layer, such as an ONO stacked structure, formed on it. A bottom anti-reflective coating (BARC) and a photoresist pattern are sequentially formed on the charge trapping layer, wherein the photoresist pattern does not cover a region of the substrate in which a buried drain will be formed. An etching process is then performed to pattern the BARC and the charge trapping layer with the photoresist pattern as a mask. The etching process is conducted in an etching chamber equipped with a source power supply and a bias power supply, which two have a power ratio of 1.5~3, while an etchant used therein is a gas plasma containing trifluoromethane ($CHF_3$) and tetrafluoromethane ($CF_4$). Thereafter, an ion implantation is performed to form a buried drain in the exposed substrate. The photoresist pattern and the BARC are removed and then a buried drain oxide layer is formed on the buried drain. A conductive layer is formed on the substrate to cover the charge trapping layer and the buried drain oxide layer and then patterned to form plural gate structures perpendicular to the buried drain.

Since the etching recipe used in this invention is capable of preventing a pull-back of the photoresist pattern, the edge of the charge trapping layer will not be doped during the ion implantation for forming the buried drain.

Moreover, since the edge portion of the charge trapping layer is not doped during the ion implantation for forming the buried drain, it will not be easily etched by chemical during the removal of the photoresist pattern and the BARC and its thickness will not be decreased.

Because the effective thickness of the edge portion of the charge trapping layer can be maintained, voltage breakdown does not easily occurs in the substrate under the edge portion and the reliability of the device is promoted.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Refer to FIGS. 2A~2E, which illustrate a process flow of fabricating a NROM according to the preferred embodiment of this invention in a cross-sectional view.

Figure 1A:
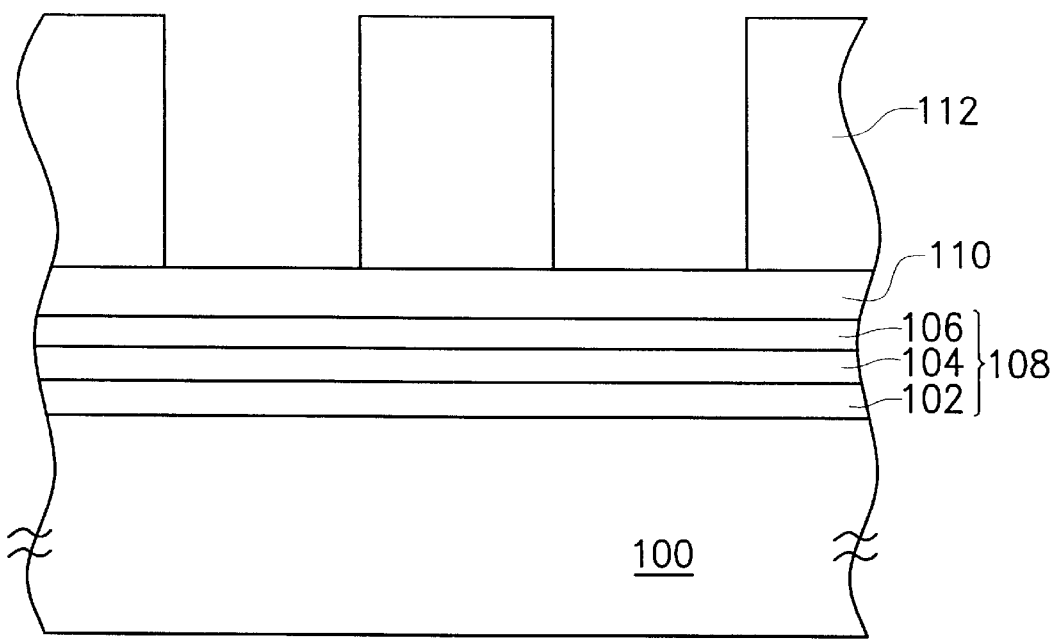
FIGS. 1A~1E illustrate a process flow of fabricating a NROM in the prior art in a cross-sectional view.
Figure 1B:
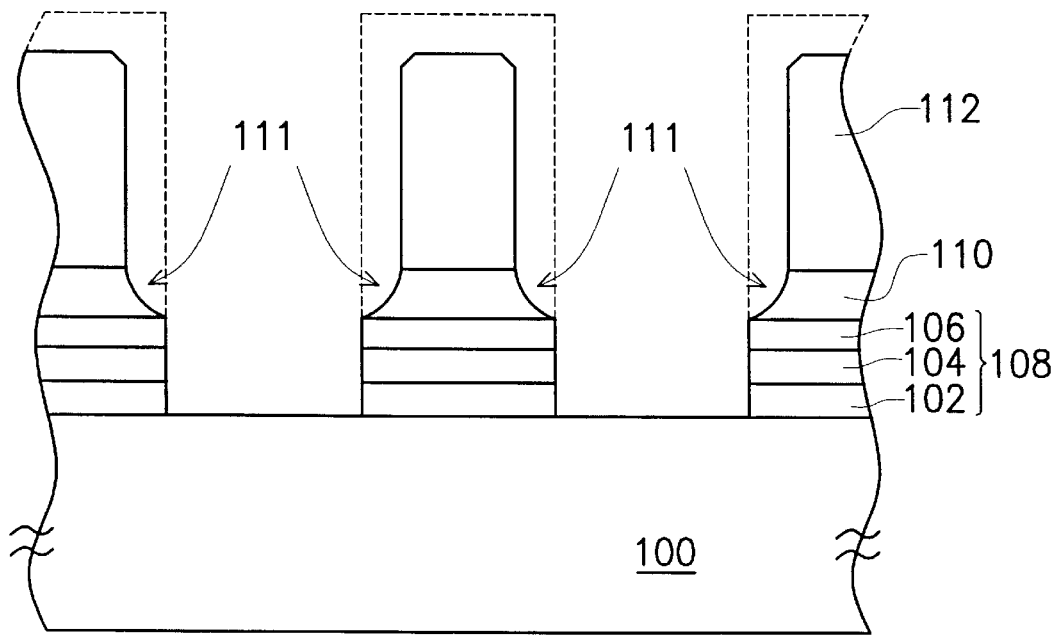
Figure 1C:
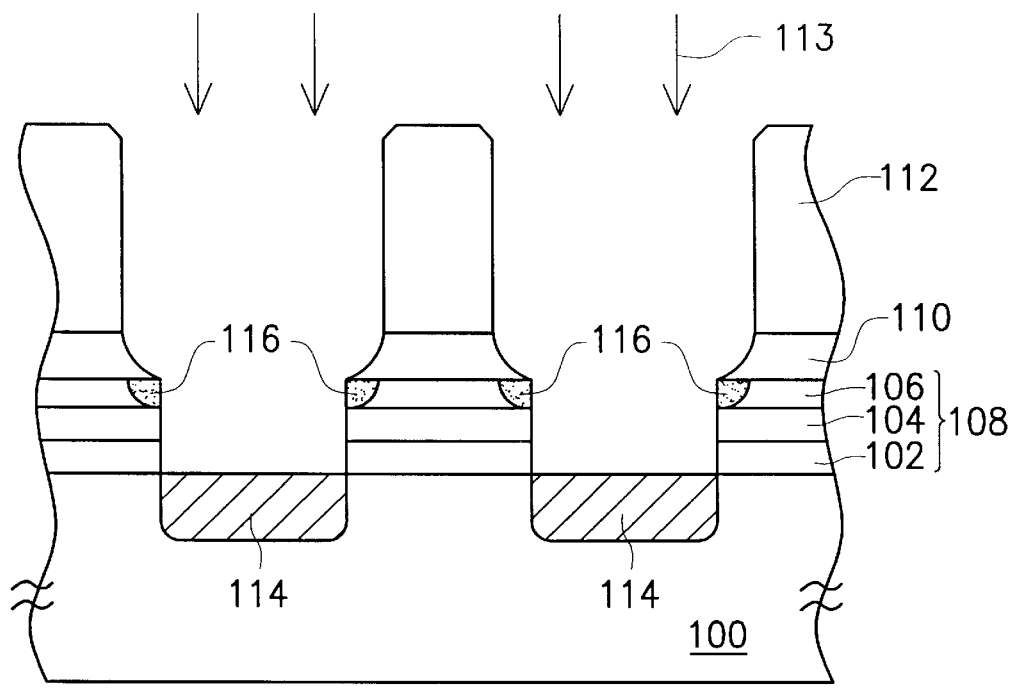
Figure 1D:
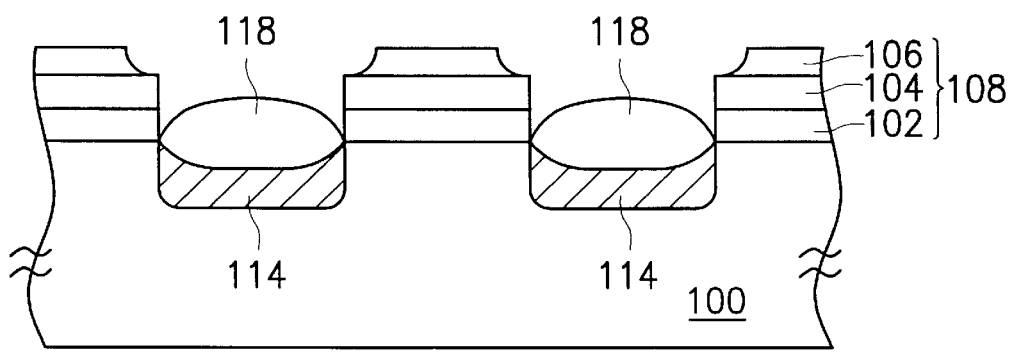
Figure 1E:
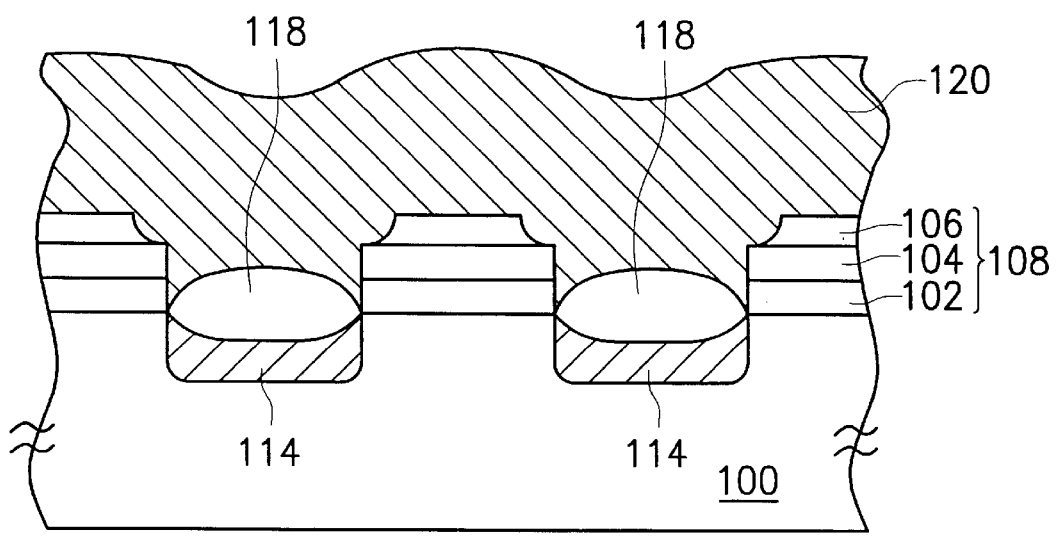
Figure 2A:
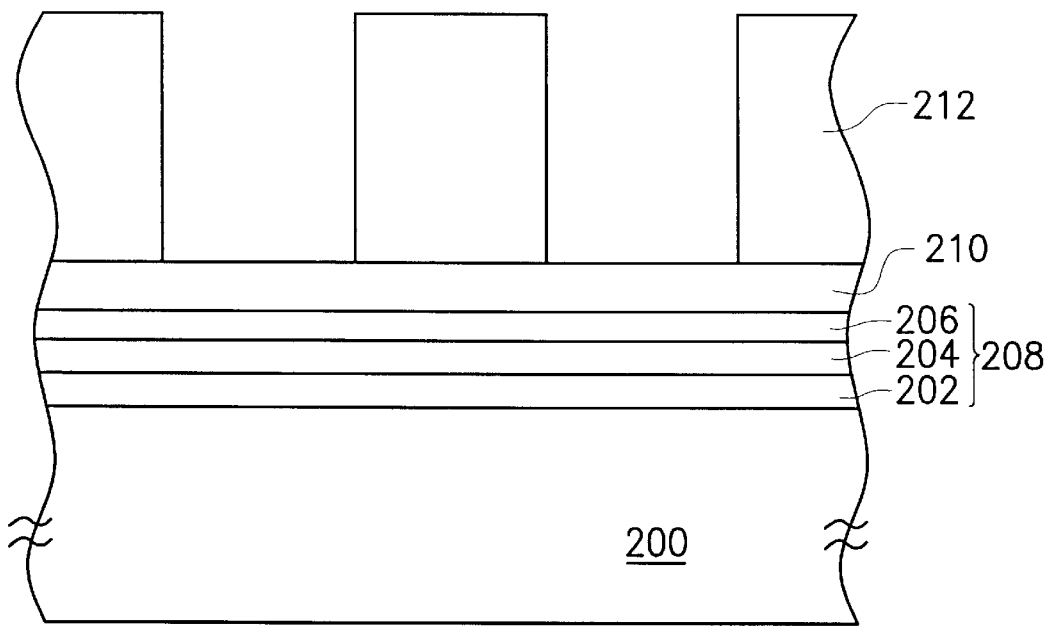
FIGS. 2A~2E illustrate a process flow of fabricating a NROM according to the preferred embodiment of this invention in a cross-sectional view.

Refer to FIG. 2A, a substrate 200 is provided with a charge trapping layer 208 formed thereon, wherein the charge trapping layer 208 is a stacked structure comprising a silicon oxide layer 202, a silicon nitride layer 204, and a silicon oxide layer 206. The thickness of the silicon oxide layer 202 is, for example, 50~90 Å, preferably 70 Å. The thickness of the silicon nitride layer 204 is, for example, 40~80 Å, preferably 60 Å. The thickness of the silicon oxide layer 206 is, for example, 40~80 Å, preferably 60 Å.

Refer to FIG. 2A again, a bottom anti-reflective coating (BARC) 210 is formed on the charge trapping layer 208 to improve the precision of the subsequent photolithography process. A photolithography process is then performed to form a photoresist pattern 212 on the bottom anti-reflective coating 210, wherein the photoresist pattern 212 does not cover a region of the substrate 200 predetermined as a buried drain.

Figure 2B:
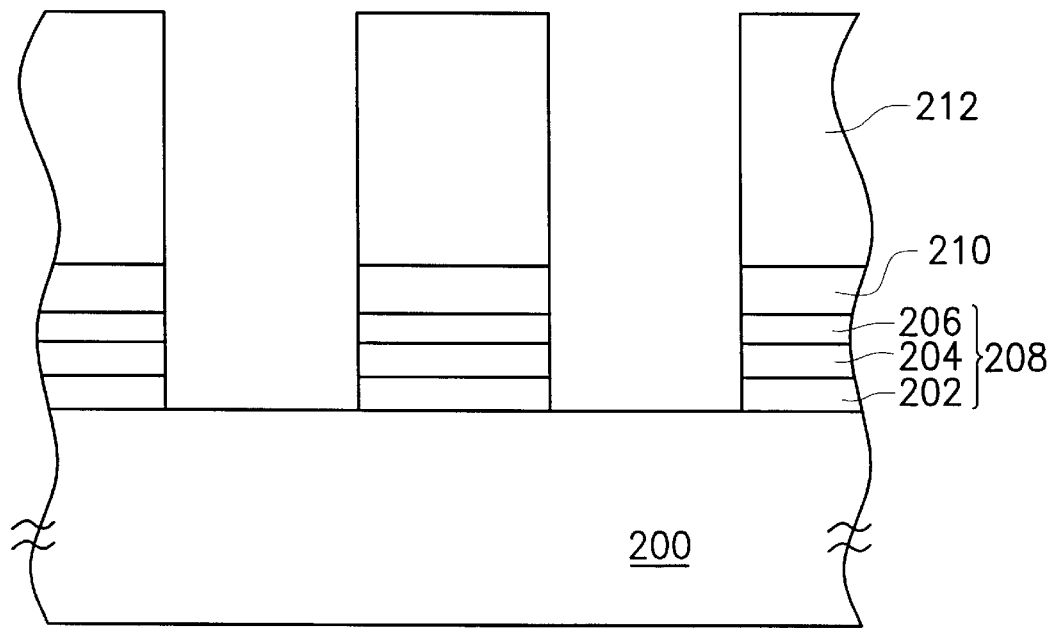

Refer to FIG. 2B, an etching process is then executed to remove the bottom anti-reflective coating (BARC) 210 and the charge trapping layer 208 not covered by the photoresist pattern 212, so as to expose a portion of the substrate 200.

The etching process for etching the BARC 210 and the charge trapping layer 208 is conducted in an etching chamber equipped with a source power supply for generating a plasma and a bias power supply for applying a bias on a wafer. The ratio of the power provided by the source power supply to the power provided by bias power supply ranges from 1.5 to 3. The power supplied from the source power supply ranges from 200 W to 400 W and the power supplied from the bias power supply ranges from 100 W to 200 W. Besides, the etchant used in the etching process is, for example, a gas plasma of trifluoromethane ($CHF_3$) and tetrafluoromethane ($CF_4$), wherein the amount of $CHF_3$ is 80% to 90% and the amount of $CF_4$ is 10% to 20%, for example. Further, the etching process is performed under a pressure such as 40 mTorr~60 mTorr.

By using the above-mentioned etching recipe to conduct the etching process, a pull-back of the photoresist pattern 212 can be prevented so that an indentation at the edge of the bottom anti-reflective layer 210 can be avoided from forming.

Figure 2C:
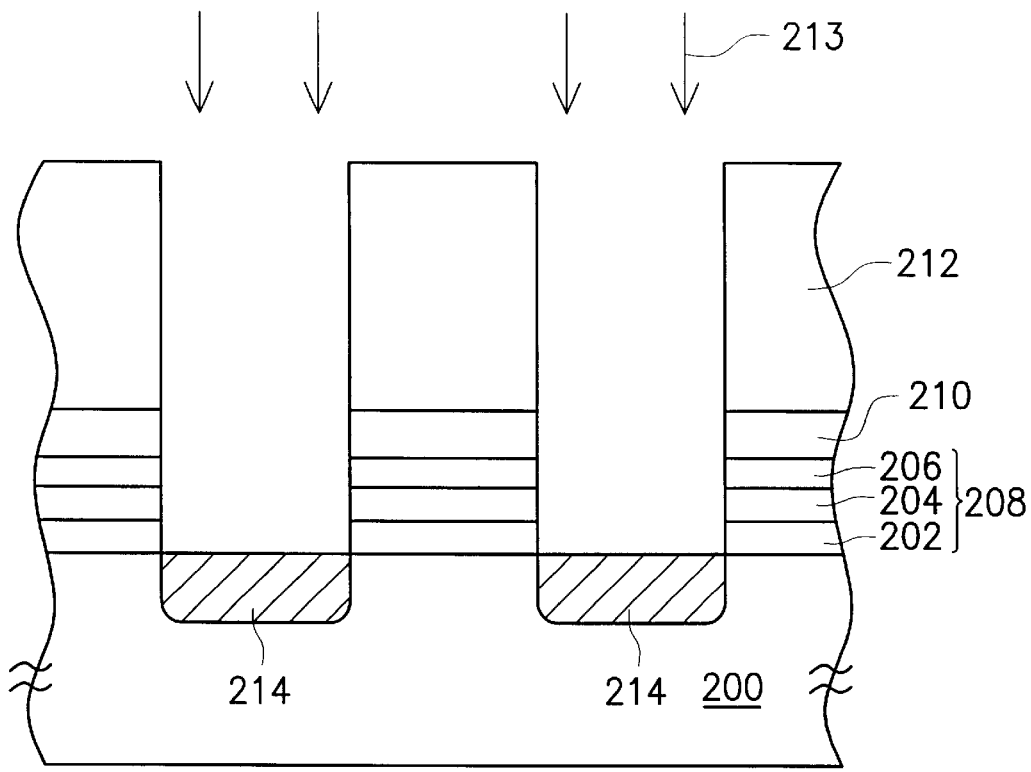

Refer to FIG. 2C, a buried drain 214 is then formed in the exposed substrate 200 by performing an ion implantation with the photoresist pattern 212 as a mask.

Since the step of patterning the BARC 210 and the charge trapping layer 208 does not cause an indentation to form at the edge of the BARC 210, the edge portion of the charge trapping layer 208 will not be implanted during the ion implantation step.

Figure 2D:
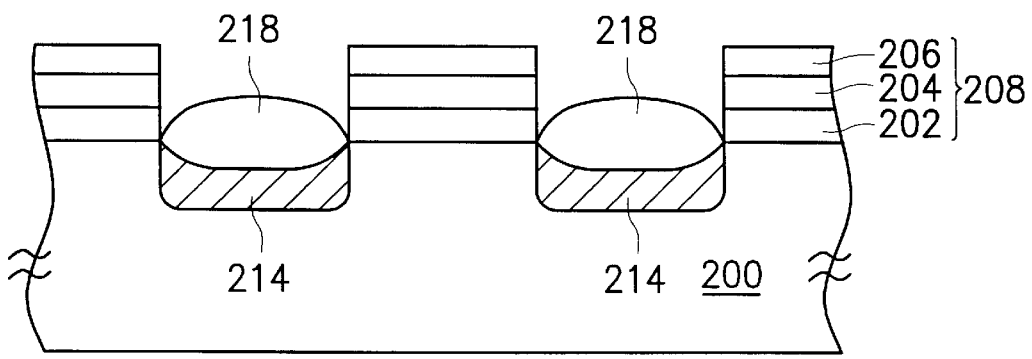

Refer to FIG. 2D, the photoresist pattern 212 and the BARC 210 are then removed to expose the charge trapping layer 208. Since the edge portion of the charge trapping layer 208 is not doped during the preceding ion implantation step, it will not be etched and therefore its effective thickness can be retained.

Refer to FIG. 2D again, an insulating layer 218 is then formed on the buried drain 214. The insulating layer 218 comprises, for example, silicon oxide and is formed by a method such as thermal oxidation. The insulating layer 218 formed by thermal oxidation is called a "buried drain oxide layer".

Figure 2E:
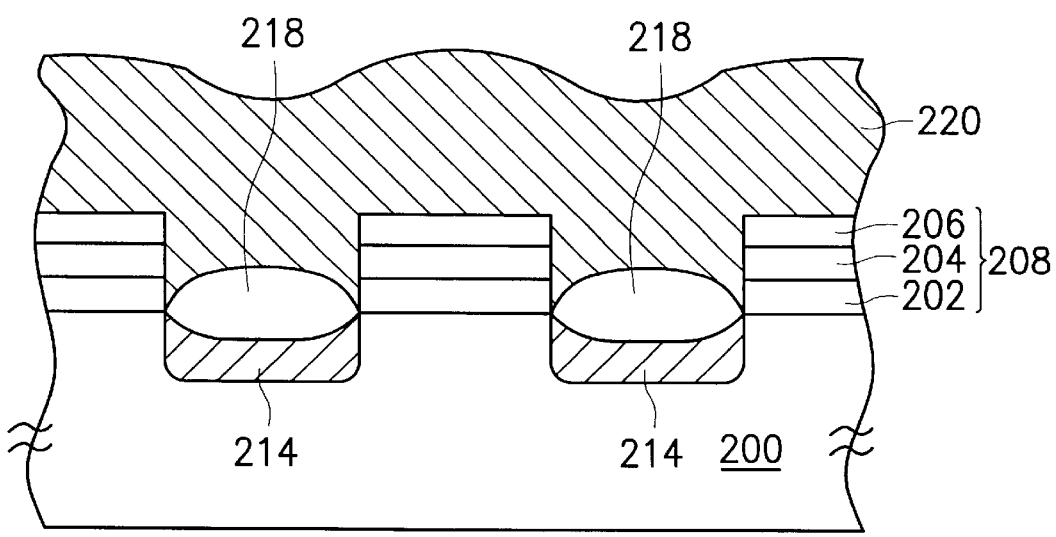

Refer to FIG. 2E, a conductive layer 220, such as a polysilicon layer, is then formed on the substrate 200 to cover the charge trapping layer 208 and the buried drain oxide layer 218. Finally, the conductive layer 220 is patterned to form plural gate structures (not shown) perpendicular to the buried drain 214, thus completing the NROM process of this invention.

Since the etching recipe used in this invention is capable of preventing a pull-back of the photoresist pattern, the edge portion of the charge trapping layer will not be doped during the ion implantation for forming the buried drain.

Moreover, since the edge portion of the charge trapping layer is not doped during the ion implantation for forming the buried drain, it will not be easily etched during removing the photoresist pattern and the BARC and its thickness will not decrease.

Furthermore, because the effective thickness of the edge portion of the charge trapping layer can be retained, voltage breakdown does not easily occurs in the substrate under the edge portion of the charge trapping layer so that the reliability of the device is promoted.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a NROM, comprising the steps of:

providing a substrate that has a charge trapping layer formed thereon;

forming sequentially a bottom anti-reflective layer (BARC) and a photoresist pattern on the charge trapping layer;

conducting an etching process to remove an exposed bottom anti-reflective layer and an exposed charge trapping layer with the photoresist pattern as a mask, the etching process being conducted in an etching chamber equipped with a source power supply and a bias power supply, while a power ratio of the source power supply to the bias power supply ranges from 1.5 to 3;

forming a buried drain in the exposed substrate;

removing the photoresist pattern and the bottom anti-reflective coating;

forming an insulating layer on the buried drain;

forming a conductive layer on the substrate to cover the charge trapping layer and the insulating layer; and patterning the conductive layer to form a plurality of gate structures.

2. The method of claim 1, wherein a power supplied from the source power supply ranges from 200 W to 400 W.

3. The method of claim 1, wherein a power supplied from the bias power supply ranges from 100 W to 200 W.

4. The method of claim 1, wherein an etchant used in the etching process comprises a gas plasma containing trifluoromethane ($CHF_3$) and tetrafluoromethane ($CF_4$).

5. The method of claim 4, wherein an amount of trifluoromethane in the gas plasma ranges from 80% to 90%.

6. The method of claim 4, wherein an amount of tetrafluoromethane in the gas plasma ranges from 10% to 20%.

7. The method of claim 1, wherein the etching process is conducted under a pressure of from 40 mTorr to 60 mTorr.

8. The method of claim 1, wherein the charge trapping layer comprises asilicon oxide/silicon nitride/silicon oxide (ONO) stacked structure.

9. The method of claim 1, wherein the conductive layer comprises polysilicon.

10. The method of claim 1, wherein the insulating layer comprises silicon oxide.

11. The method of claim 1, wherein the method for forming the insulating layer comprises thermal oxidation.

12. The method of claim 1, wherein the method for forming the buried drain comprises ion implantation.

13. A method for patterning a charge trapping layer in a NROM, comprising the steps of:

providing a substrate that has a charge trapping layer on it;

forming sequentially a bottom anti-reflective layer (BARC) and a photoresist pattern on the charge trapping layer; and conducting an etching process to remove an exposed bottom anti-reflective layer and the exposed charge trapping layer with the photoresist pattern as a mask, the etching process being conducted in an etching chamber equipped with a source power supply and a bias power supply, while a power ratio of the source power supply to the bias power supply ranges from 1.5 to 3.

14. The method of claim 13, wherein a power supplied from the source power ranges from 200 W to 400 W.

15. The method of claim 13, wherein a power supplied from the bias power supply ranges from 100 W to 200 W.

16. The method of claim 13, wherein an etchant used in the etching process comprises a gas plasma containing trifluoromethane ($CHF_3$) and tetrafluoromethane ($CF_4$).

17. The method of claim 16, wherein an amount of trifluoromethane in the gas plasma ranges from 80% to 90%.

18. The method of claim 16, wherein an amount of tetrafluoromethane in the gas plasma ranges from 10% to 20%.

19. The method of claim 13, wherein the etching process is conducted under a pressure of from 40 mTorr to 60 mTorr.

20. The method of claim 13, wherein the charge trapping layer comprises an silicon oxide/silicon nitride/silicon oxide (ONO) stacked structure.

* * * * *